United States Patent [19]

Markowski et al.

[11] Patent Number: 5,773,951
[45] Date of Patent: Jun. 30, 1998

[54] WAFER PROBER HAVING SUB-MICRON ALIGNMENT ACCURACY

[75] Inventors: Paul S. Markowski; Theodore J. Cosby, both of San Jose, Calif.

[73] Assignee: Digital Test Corporation, San Jose, Calif.

[21] Appl. No.: 621,494

[22] Filed: Mar. 25, 1996

[51] Int. Cl.⁶ .................................................. G05B 11/32
[52] U.S. Cl. ........................................... 318/625; 318/652
[58] Field of Search ..................................... 318/652, 653, 318/565, 567, 575, 577, 640, 648, 649, 625; 269/58, 61, 60

[56] References Cited

U.S. PATENT DOCUMENTS

| | | | |
|---|---|---|---|
| 4,093,378 | 6/1978 | Horr et al. | 269/21 X |
| 4,115,735 | 9/1978 | Stanford | 324/158 |
| 4,247,203 | 1/1981 | Levy et al. | 356/398 |
| 4,347,001 | 8/1982 | Levy et al. | 356/398 |
| 4,442,388 | 4/1984 | Phillips | 318/640 |
| 4,639,587 | 1/1987 | Chadwick et al. | 250/201 |
| 4,714,327 | 12/1987 | Marshall | 350/504 |
| 4,772,835 | 9/1988 | Weaver et al. | 318/640 |
| 4,775,220 | 10/1988 | Penkethman | 350/394 |
| 4,789,874 | 12/1988 | Majette et al. | 318/640 X |
| 4,864,227 | 9/1989 | Sato | 324/158 |
| 4,877,326 | 10/1989 | Chadwick et al. | 356/394 |
| 4,926,489 | 5/1990 | Danielson et al. | 382/8 |
| 4,953,961 | 9/1990 | Ubhayakar | 350/486 |
| 4,983,900 | 1/1991 | Nashiki et al. | 318/652 |
| 5,410,259 | 4/1995 | Fujihara et al. | 324/758 |
| 5,528,955 | 6/1996 | Hannaford et al. | 318/568.1 |
| 5,566,584 | 10/1996 | Briganti | 74/490.07 |

Primary Examiner—Jonathan Wysocki
Attorney, Agent, or Firm—D'Alessandro & Ritchie

[57] ABSTRACT

A wafer prober for testing uncut die of a semiconductor wafer has an alignment accuracy in the X-Y plane within the sub-micron range. The wafer, held by a chuck, is positioned in the X-Y plane by using a pair of linear servo motors each driven by a servo drive unit providing drive control, monitoring and diagnostic functions. Positional information is obtained from a pair of linear encoders, one along each drive axis. Positional information is also obtained from a pair of resolvers, one for the vertical axis and the other for rotational position about the vertical axis. Ways and runner blocks are used to provide substantial downforce capability and high speed translational movement. In addition, the present invention uses a general purpose computer providing for an on-board controller card interfacing with the servo drives via a fiber optic coupler. Wafers are automatically loaded onto the chuck by an on-board juke box-type loader capable of handling wafer sizes of between four (4) and twelve (12) inches in diameter. Connectivity to a network for off-side or local trouble-shooting or programming can be provided by the computer in addition to a pager or other form of alert in the event of a detected failure-mode.

26 Claims, 4 Drawing Sheets

WAFER PROBER HAVING SUB-MICRON ALIGNMENT ACCURACY

BACKGROUND OF THE INVENTION

1. Field of the Invention

This invention relates to wafer probers used to position a semiconductor wafer for testing with automatic test equipment. More particularly, this invention relates to a wafer prober using a pair of linear servo motors to provide sub-micron X-Y positioning of the wafer.

2. Description of the Related Prior Art

Wafer probers are used to test semiconductor circuits on a semiconductor wafer before it's cut into individual circuit die and then packaged or sold as "known good die." Typically a wafer prober operates in a specific sequence either through preprogrammed instructions or through operator control, or both. The main purpose of a wafer prober is to load finished semiconductor wafers onto a moveable wafer platform and to align the wafer with a fixed probe card, or similar automatic test equipment ("ATE"). The probe card typically has a number of test probes that electrically and physically contact bonding pads located on each die of a wafer to be tested. Once each die is tested, the ATE records the results and then the wafer is unloaded from the wafer platform and replaced with another untested wafer. Typically, the loading and unloading of wafers onto the wafer platform is accomplished by a juke box-type loader having a loading arm and a cassette for holding the wafers.

A probe card is fixed above the X-Y plane in which the wafer platform moves. The probe card typically carries several test probes although it is possible for a probe card to carry 250 probes or more at one time.

The testing of a semiconductor wafer circuit die using a probe card fixed above a chuck involves the following steps: (1) a wafer is unloaded from its wafer cassette or similar holding bin, and placed on the wafer platform; (2) the wafer is held by vacuum on the chuck ("vacuum-locked"); and (3) the wafer platform is moved along the X, Y, and Z (vertical axes) and is rotated about the Z axis by an angle, theta ($\phi$), thereby aligning and contacting a number of targeted bonding pads with a corresponding number of test probes located on the probe card.

Aligning bonding pads with test probes so that all of the targeted bonding pads contact with their corresponding test probes, i.e., "probing," is a critical feature of a wafer prober. In addition, not only should a wafer prober be able to successfully probe a die, but it should also be able to successfully probe all die located on a wafer. The success rate of probing successive die on a wafer is defined as the "repeatability" of a wafer prober and directly affects the yield of tested circuit die per wafer. The higher the repeatability of a wafer prober leads to a higher yield of tested circuit die per wafer.

However, repeatability is dependent on a wafer prober's ability to consistently align bonding pads of multiple die on different locations of a wafer with a given set of test probes for a given bonding pad contact area. This ability to consistently align multiple die with their corresponding test pads, in turn, is related to a wafer prober's ability to minimize the possible contact area in which a test probe may make electrical contact, i.e., "alignment accuracy." Thus, increasing the alignment accuracy of a wafer prober in the X-Y stage, gives semiconductor circuit manufacturers higher tested circuit die per wafer yields and reduces design constraints with respect to the sizing and layout of bonding pads.

For example, if a given wafer prober has an alignment accuracy of +/−4 microns, and a target wafer circuit die bonding pad center is located on the wafer platform at an arbitrary location of 0, 0 in a Cartesian X-Y plane parallel to the plane of the wafer platform, the wafer prober can only guarantee to place the wafer probe in a box defined as +/−4 microns of 0, 0, i.e., the box defined by the points (in microns) −4, −4; −4, +4; +4, +4; and +4, −4. As a practical matter, a bonding pad must have a minimum size at least somewhat larger than the 64 square micron box defined above to guarantee that a 4 micron wafer prober can successfully cause the probes to contact the bonding pad every time.

Many present wafer probers utilize screw-type drives which accumulate "slack" or error as they are driven from their minimum extended lengths to their maximum extended lengths. Where the positioning of such screw-type drives is measured by step-counts of a stepping motor, or by a shaft encoder at one side of the screw drive, or by similar means, an additional error known as "backlash" effectively increases the minimum necessary size of the bonding pad in order to insure that the probe will always be able to contact the bonding pad. In practice, some additional room should be provided, say 50–100%. If the size of the bonding pad is not increased to take backlash into account, the probes will have less likelihood of contacting their targeted bonding pads and may contact the top of the die itself. If so, the circuit die associated with the missed bonding pad will not be correctly tested and therefore will likely be determined by the ATE to be defective; or the errant test probe may contact a circuit layer instead and damage that circuit. In either case, tested circuit die per wafer yield decreases not because of a defect in the die or manufacturing process but because of a wafer prober having an alignment accuracy not well suited for a given bond pad size, as illustrated in the above example.

To increase tested circuit die per wafer yield thus entails increasing the area size of the bonding pads where a wafer prober's alignment accuracy is taken as a given. However, increasing bonding pad size imposes circuit die design and layout constraints. Also, increasing bonding pad size may not be possible if the increase in bonding pad size exceeds the circuit die's design parameters such as capacitance limits. Accordingly, a better approach would be to provide a wafer prober having a significantly improved alignment accuracy that permits a semiconductor manufacturer to have a great deal of latitude in selecting bonding pad size while maximizing tested circuit die per wafer yield.

The problem of backlash becomes a bigger hurdle where a prober card contains a large number of test probes. For example, a probe card may carry up to 250 test probes or more for simultaneous testing of a corresponding number of bonding pads. Also, the bonding pads and the test probes may not be consistently spaced apart, lending to some uncertainty in their exact location, and consequently, the possible contact area may not be accurately limited to an area having an X and Y dimension twice of the wafer prober's stated alignment accuracy but within a larger area. This effectively reduces the surface area upon which a test probe may safely backlash before missing the bonding pad. A wafer prober with an alignment accuracy in the sub-micron range has heretofore not been available but would greatly minimize this hurdle.

Another problem with wafer probers is the need to insure that all of the test probes are sufficiently pushed against the bonding pads so as to form electrical contacts with the bonding pads after proper alignment. The problem becomes more acute where there are many probes requiring contact or where the probing takes place at the outer periphery of a wafer. This problem arises because it is impossible to insure that the wafers to be tested will be uniformly flat or uniform from wafer to wafer. It is further impossible to insure that all probes will be of identical length or that all bonding pads will be of identical height.

The more test probes used results in more force required along the Z axis because not all of the test probes terminate at a median contact plane (i.e., the plane reflecting the median point of termination by the contact tips of all of the test probes used). Therefore, to ensure that all test probes contact a targeted bonding pad, the test probes that hit first, i.e., test probes that extend beyond the median contact plane, are flexed by increasing the force along the Z axis until the test probes behind the median contact plane make contact with their respective bonding pads.

In addition, ensuring that all targeted bonding pads make contact with their corresponding test probes requires more force along the Z axis as probing occurs at the outer periphery of a wafer since all chucks incur some deflection. Accordingly, because of the deflection, more force is required to flex the test probes extending beyond the median contact plane, which in turn, requires a Z stage capable of providing for and withstanding the increase in force required.

The typical known prior art wafer probers only have the capability to provide a maximum force rating of less than about 50 pounds (23 Kgs) along the Z axis. A small force rating generally limits a wafer prober's ability to handle large numbers of test probes or wafer sizes, or both. Moreover, as wafer sizes in the twelve inch diameter range enter the market, probing at the outer periphery of the wafer will require wafer probers having wafer platforms capable of providing and withstanding the force required (i.e., have better deflection ratings and stronger Z stage motors) along the Z axis.

Moreover, each test probe suffers from some form of wear at the tip after extended use. The wear on the test probe tip changes the test probe's expected point of termination further reducing a wafer prober's alignment accuracy. A wafer prober with an alignment accuracy in the sub-micron range that uses "closed-loop positional feedback" would greatly minimize this hurdle. Closed-loop positional feedback permits a wafer prober to actively position the location of a chuck by constantly reading a reference scale dispose along a plane of movement to determine the position of the chuck at any given moment.

One prior art approach for providing for movement in the X-Y plane employs a servo motor in combination with a ball screw assembly for the X and Y axes on the X-Y plane. For each revolution of the motor, a proportional change in distance along the ball screw results. However, because of "backlash" between the threads of the ball screw assembly, an imprecision inherent in this approach, the change in linear distance does not always correspond precisely to the change in rotation distance. Also, the alignment inaccuracy increases with wear and tear, brought on by extended use.

Another limitation to this approach is the speed with which the chuck may be moved along either the X or Y axis. Higher alignment accuracy, among other things, is obtained by using ball screws having very high thread count to length ratios, i.e., low screw pitch. This permits greater alignment accuracy, but also results in the disadvantage of a decrease in linear displacement per given ball screw rotation. This in turn reduces the speed of linear travel relative to a given motor rpm.

KLA Instruments Corporation manufactures a wafer prober, known as the model P8, using the above ball screw assembly. It aligns the chuck along the X-Y plane by sensing the rotational position of each ball screw rather than the actual position of the chuck along the X-Y plane. This approach derives rather than measures the actual location of the chuck. While fit for its intended purpose, the model P8 has a published X-Y stage alignment accuracy of +/−4.0 microns and a maximum speed in the X-Y plane of 200 mm per second (7.87 inches per second).

Another approach for providing alignment in the X-Y plane is illustrated by a wafer prober manufactured by Electroglas known as the Horizon 4060X model. The Horizon 4060X employs a planar twin axis linear motor and has a published alignment accuracy of +/−5 microns and a maximum speed in the X-Y plane of 330 mm per second (13 inches per second).

The 4060X uses a stationary ferromagnetic platen having a grid pattern on its surface and a moveable platform "forcer" holding the chuck. The platen is mounted on a rigid base casting and is immoveable. The moveable platform glides over the grid patterned platen on a friction-free cushion of air, or air bearing. The forcer is a rectangular platform having a pair of orthogonal single-axis electromagnets, an air-bearing suspension system and mounting connections for the chuck. The forcer can travel simultaneously along both X and Y axes, but each axis is individually controlled. The resolution and accuracy of placement of the platform within the X-Y plane is limited by the grid pattern spacing. Thus, the resolution and alignment accuracy obtained by this design is dependent on the spacing of the grid pattern.

The 4060X requires an offset calibration during manufacture. It entails moving the forcer incrementally along the grid pattern. Should the forcer mis-align with a targeted coordinate within the grid pattern, an off-set correlation value is entered for that position to ensure proper alignment of the forcer along that position. This process is repeated until the full range of movement of the forcer has been mapped out.

While suited for its intended purpose, this approach of using a linear motor riding on an air cushion incurs design constraints not well suited to using large numbers of test probes or large diameter wafer sizes. The air cushion, sustained by a given air pump capacity, limits the weight of the forcer. A weight limit, in turn, limits the size of the Z-stage motor. The 4060X has a weight limit of 40 lbs. (18 kgs.). Consequently, the forcer has a limited ability to handle probe cards having large numbers of test probes since such test probe quantities require a chuck capable of applying sufficient force along the Z axis to ensure that all targeted bonding pads are contacted by all of the test probes, as described above.

Thus, while suitable for their intended purposes, these prior art wafer probers do not provide sub-micron alignment accuracy and high downforce resistance, and thus incur the disadvantages described above. Accordingly, it would be highly advantageous to provide a wafer prober technology that permits sub-micron alignment accuracy as well as significantly improved downforce resistance.

SUMMARY OF THE INVENTION

The present invention pertains to a wafer prober for testing uncut semiconductor circuit die. Sub-micron alignment accuracy is achieved using a pair of linear servo motors, each disposed along a different axis in a plane, each being positionally controlled with positional information from a corresponding pair of reference scales and scanning heads, and the reference scales disposed along each of the respective axes.

In addition, the present invention uses a general purpose computer providing for an on-board controller interfacing with the servo drive units via a fiber optic coupler. A SERCOS (Serial, Real-time, Communications Systems) interface provides for the communication protocol layer between the controller and the servo drive units. Wafers can be automatically loaded onto the chuck by an on-board juke box-type loader capable of handling wafer sizes of between four (4) and twelve (12) inches in diameter.

X-Y stage translation is provided with each stage translatable over runner/way type bearings. This approach provides downforce capability in excess of 200 pounds as well as high speed X-Y translation capability.

The present invention also provides, via the computer interface, connectivity to an ethernet local area network or the Internet for off-site trouble-shooting or programming, or both. It also provides for alert (e.g., by pager) for a predetermined event such as wafer prober failure.

OBJECTS OF THE INVENTION

An object of the invention is to provide an improved wafer prober for testing uncut semiconductor circuit die.

A further object of the present invention is to provide a wafer prober capable of sub-micron alignment accuracy thus permitting semiconductor manufactures to reduce bonding pad sizes.

A further object of the invention is to provide for a wafer prober capable of aligning a wafer in the X-Y dimensions at high speeds.

A further object of the invention is to provide a wafer prober having an interface for programming or trouble shooting, or both, via a data communication network such as an ethernet local area network or the Internet.

A further object of the invention is to provide a wafer prober having a phone/pager alert or similar warning capability to signify apparatus failure.

Another object of the invention is to provide a wafer prober having automatic wafer loading and sizing from at least one wafer cassette.

Another object of the invention is to provide a wafer prober having the capacity to mount and align wafer sizes of between four to twelve inches in diameter.

Another object of the invention is to provide a wafer prober having X, Y and Z stages capable of withstanding downforce capability in excess of 200 pounds.

DESCRIPTION OF PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
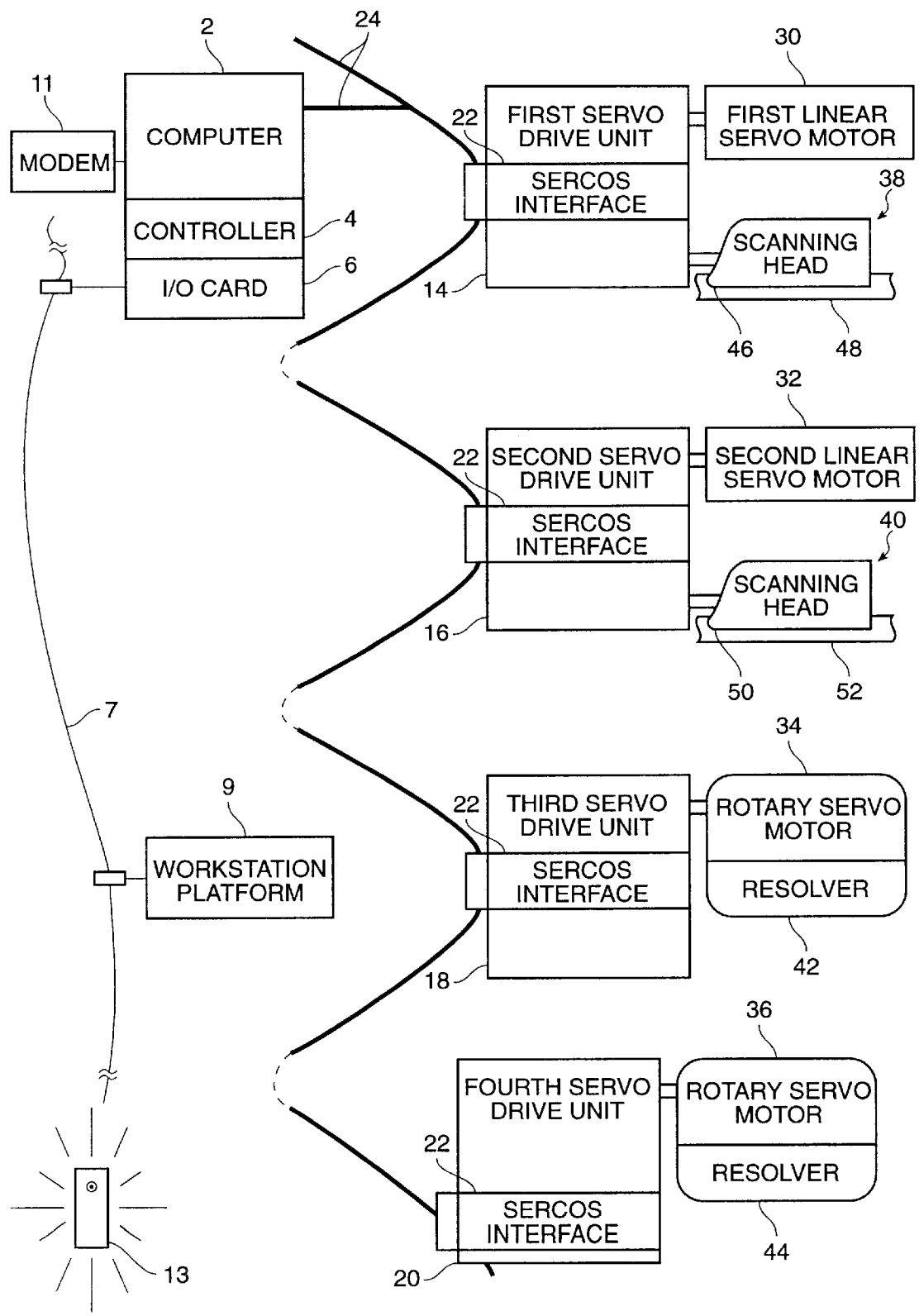
FIG. 1 is a high level diagram of a wafer prober according to a presently preferred embodiment of the present invention showing the general purpose computer connected to servo drive units and corresponding linear encoders.

FIG. 1 is a schematic diagram of a wafer prober according to a presently preferred embodiment of the present invention. It has a general purpose computer 2 having a program memory and a controller 4 for sending and receiving control and chuck position signals to and from a set of servo drive units 14, 16, 18, 20 connected to a data link 24. In the preferred embodiment, data link 24 is preferably a fiber optic coupler, currently available from HEWLETT-PACKARD of San Jose, Calif. or from THE REXROTH CORPORATION, INDRAMAT DIVISION of Wood Dale, Ill. The controller 4 is preferably model DSP Sercos, currently available from MOTION ENGINEERING, INC. of Santa Barbara, Calif. The servo drive units communicate to the computer 2 via the data link 24 via a communication interface 22 defined by "SERCOS." SERCOS is an acronym that stands for Serial, Real-time, Communications Interface and is used to define a serial data link for real-time communication between controls and drives described in detail in International Electrotechnical Commission International Standard Publication CEI-IEC-1491 First Edition (November, 1995) entitled "Electrical equipment of industrial machines— Serial data link for real-time communication between controls and drives."

The computer 2 may be any programmable computer, such as an Intel microprocessor-based computer or an equivalent computer. In the preferred embodiment, the computer 2 provides off-site diagnostics and re-programming. In the preferred embodiment, the computer 2 contains an I/O card 6 for connection to a network 7 permitting off-site trouble-shooting or re-programming by a computer platform 9. In another embodiment the computer 2 may be defined with an Internet Protocol address and modem 11 that will permit off-site trouble-shooting or re-programming through the Internet.

In another embodiment, the computer 2 provides for a status alert in the event of wafer prober failure or any other wafer prober status. For example, a failure status may be signaled by using a modem 11 in conjunction with software to trigger a pager 13 alert.

Each servo drive unit 14, 16, 18, 20 controls the operation of servo motors 30, 32, 34, 36 providing for chuck alignment along a first ("X"), second ("Y"), and third ("Z") (vertical) axis; and rotational movement about the Z axis measured by the angle theta. In addition, besides motor drive control, the servo drive units 14, 16, 18, 20 provide for monitoring and diagnostic functions related to the operation of the servo motors as understood by those of ordinary skill in the art.

The servo drive units 14, 16 for the X and Y stages are preferably model DDS3.1-WO50DS13, currently available from The REXROTH CORPORATION, INDRAMAT DIVISION of Wood Dale, Ill. The linear servo motors 30, 32 driven by servo drive units 14, 16, respectively, are preferably model LAF 050, currently also available from the REXROTH CORPORATION, INDRAMAT DIVISION of Wood Dale, Ill.

The servo drive units 18 and 20 for the Z and theta stages, in the preferred embodiment are known as model SC902 servo drive units and currently available from PACIFIC SCIENTIFIC of Wilmington, Mass. These servo drive units control rotary servo motors 34, 36 preferably model 4113 and 3111, respectively. Both models are currently available from PITTMAN of Harleysville, Pa.

In the preferred embodiment, linear servo motors 30, 32 use linear encoders 38, 40 in combination with servo drive units 14, 16. Both linear servo motors 30, 32 are preferably model LIDA 201, currently available from HEIDENHAIN of Germany. The linear encoders each have a scanning head and reference scale that permit the computer 2 and servo drive units 14, 16 to determine the X and Y position of the scanning head 46, 50 within a certain alignment accuracy. Because of the closed loop feedback design, described above, the alignment accuracy is dependent on the linear encoder and servo drive unit used.

Rotary servo motors 34, 36 are also driven by servo motor drivers 18, 20, but the drivers 18, 20 each use a rotational position sensor such as resolvers 42, 44, respectively. The resolvers 42, 44 are preferably model 3620 M003 E001 R001, currently available from Admotec of Norwich, Vt.

Figure 2:
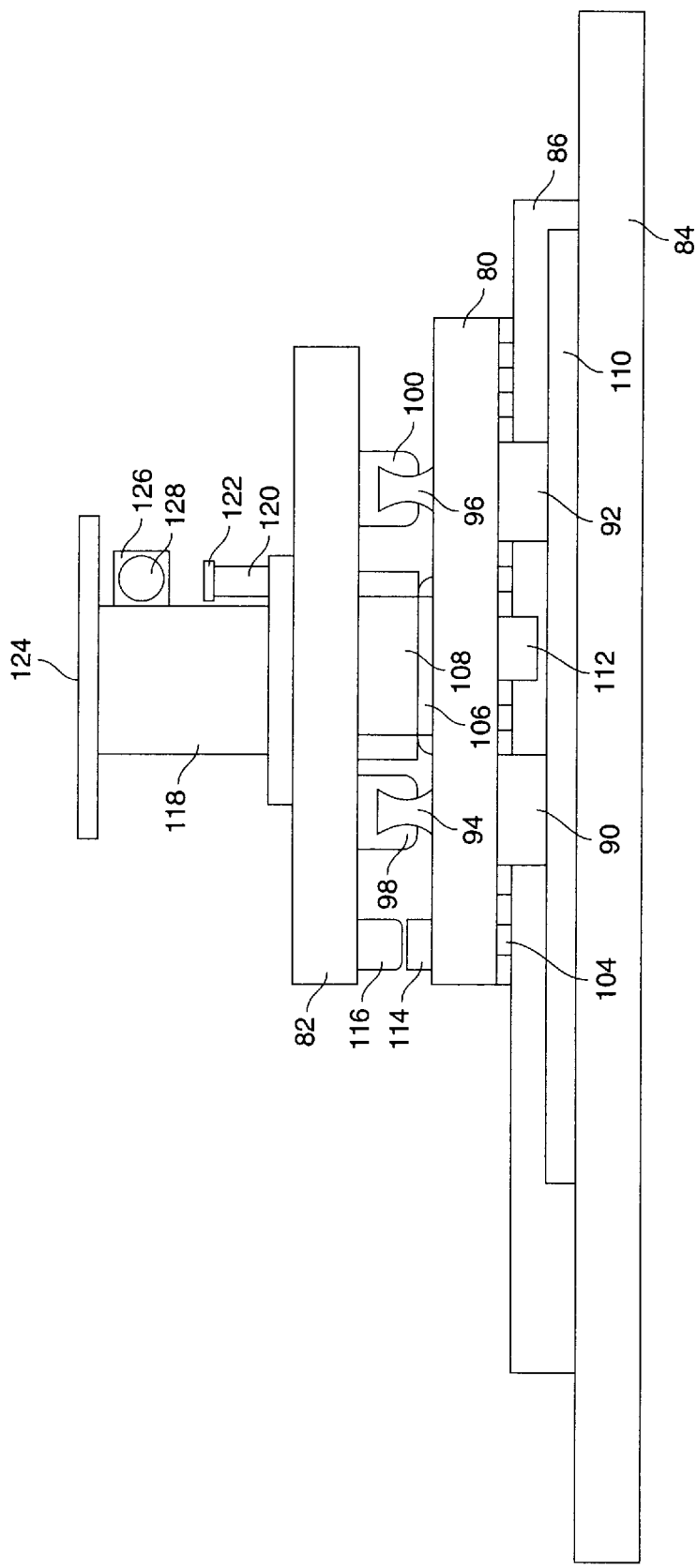
FIG. 2 is a side-view of a wafer prober according to a presently preferred embodiment of the present invention showing its X, Y, and Z stage assemblies and wafer chuck.
Figure 3:
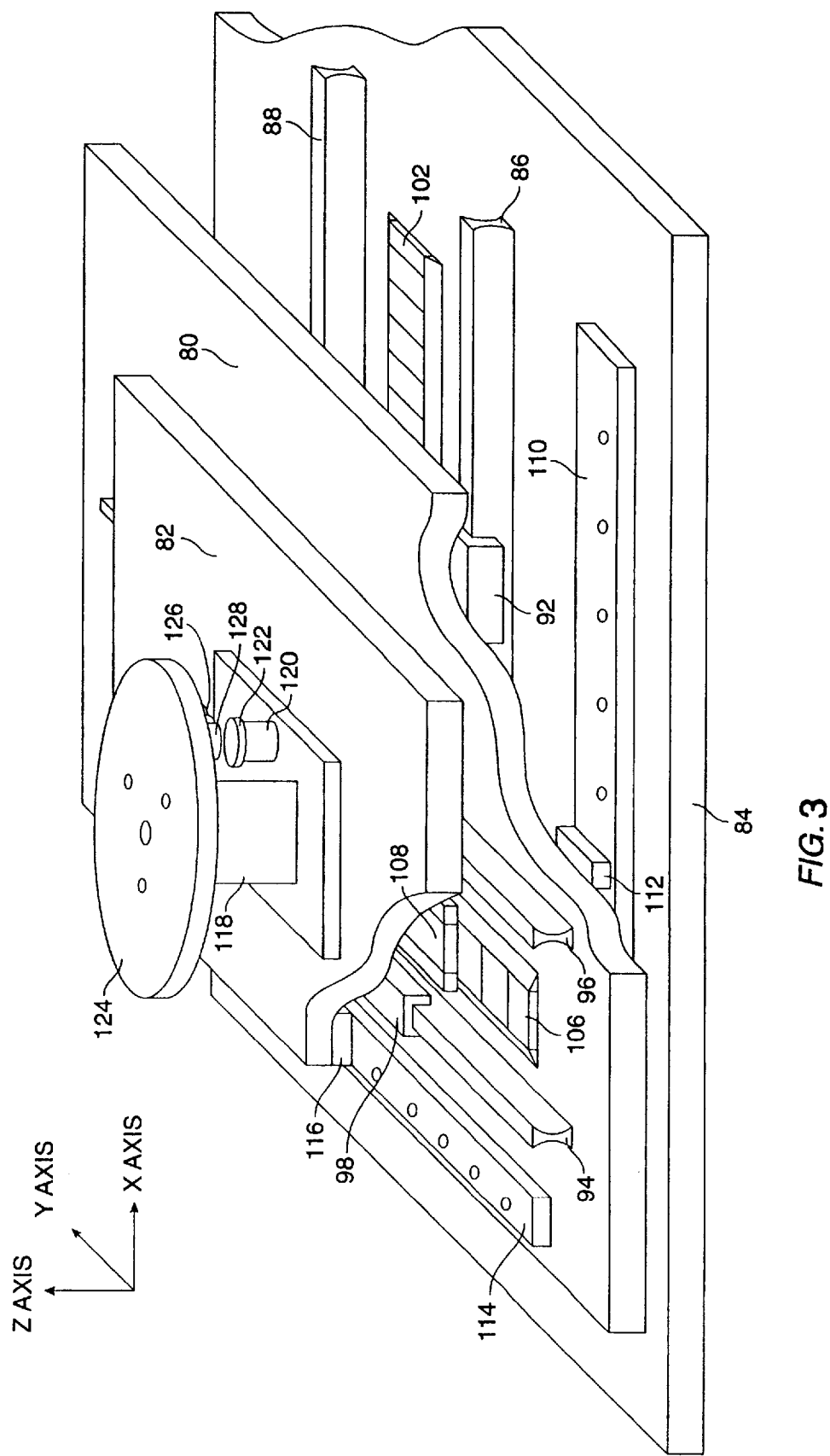
FIG. 3 is a perspective view of a wafer prober according to a presently preferred embodiment of the present invention showing its X, Y, and Z stage assemblies and wafer chuck.

FIGS. 2–3 show one embodiment of the present invention. The first and second stages 80, 82 are built on a base 84. Attached to the base 84 are a pair of ways 86, 88. The first stage 80 is attached to the pair of ways 86, 88 via four runner blocks, two runner blocks per way. In this embodiment, the runner blocks and ways are available as a set, preferably model Runner Block Series 1651-212-10, and are currently available from Star Linear Systems of Illinois. Because of the side view, FIG. 2 only shows the two runner blocks 90, 92 on way 86. The ways 86, 88 and runner blocks 90, 92 permit the first stage 80 to move back and forth along a first axis which is referred to as the "X axis" in this embodiment.

FIGS. 2–3 also show the first stage 80 attached to a pair of ways 94, 96 on its surface opposite to the base 84. The second stage 82 is attached to the pair of ways 94, 96 via four runner blocks, two runner blocks per way. Again, because of the side view, FIG. 2 only shows two runner blocks 98, 100. The ways 94, 96 and runner blocks 98, 100 permit the second stage 82 to move back and forth along a second axis which is referred to as the "Y axis" in this embodiment. The use of runner blocks and ways for the first and second stages 80, 82 permit them to move along the X-Y plane while bearing a significant amount of weight. In this embodiment, the X-Y stage can bear a maximum of at least between 200–600 pounds.

FIGS. 2–3 also show the use of linear servo motors for moving the first and second stages along a first and second axis and are the type described above. For the purposes of the language used in the appended claims, a linear motor comprises a first winding and a second winding. The first winding has three-phase winding and is called a stator. The second winding has a squirrel-cage winding and is called a rotor even though it does not rotate.

In the preferred embodiment, the first winding is mounted on the moveable first and second stages because the type of linear servo motors used have a first winding that has fixed dimensions. The overall length of the secondary winding depends on the traverse path since it is made up by mounting a selected number of fixed length secondary elements. However, it makes little difference whether a particular element of a linear motor is a rotor or a stator as long as each pair of opposed elements includes one rotor and one stator. Thus, in the claims, the term "linear motor element" will refer to either a rotor or a stator: thus, where a first linear motor element and a second linear motor element are adjacent and opposed, one is a rotor and the other is a stator and the two form a linear servo motor.

For moving the first stage 80 along the first axis, a first linear servo motor has a first linear motor element 102 on the surface of the base 84 parallel to the first axis. The second linear motor element 104 is disposed on the second side of the first stage 80 directly opposite to and facing its complimentary second linear motor element 102, as shown in FIG. 3.

For moving the second stage 82 along the second axis, a second linear servo motor is disposed on the first and second stages 80, 82. It has a third linear motor element 106 disposed parallel to the first axis on the second side of the first stage 80, i.e., the side opposite of the ways 86, 88 disposed on the base 84. The second linear servo motor has a fourth linear motor element 108 disposed on the first side of the second stage 82 and directly opposite to and facing the second linear motor element 106. The fourth linear motor element 108 is aligned in parallel to the second axis. In the preferred embodiment, the first and second linear servo motors are capable of moving the first and second stages at an average speed of 355.7 mm per second (14 inches per second) from point to point. In the preferred embodiment, both linear servo motors, are capable of a maximum speed of 3 meters per second (118 inches per second).

Providing alignment accuracy for both first and second linear servo motors entails having a first and second linear encoder. The first and second linear encoders each have a scanning head and a "reference scale," preferably model LIDA 201 from HEIDENHAIN from Germany. When combined with the Indramat servo drive unit and linear encoders in a closed-loop manner, described above, the first and second linear servo motors can provide alignment accuracy within the range of plus or minus five tenths of a micron (+/−0.5 microns).

In the preferred embodiment, the first reference scale 110 is mounted on the base 84 parallel to the first axis. The first reference scale 110 contains positional markings that are read by the first scanning head 112 which is mounted on the first stage 80 in a manner suitable for reading the first reference scale 110. The second reference scale 114 is disposed on the first stage 80 parallel to the second axis. Like the first reference scale 110, the second reference scale 114 contains positional markings that are read by the second scanning head 116.

Using a linear encoder and a servo drive unit to obtain an alignment accuracy with +/−0.5 microns is best described by the following example. Referring to FIG. 1, the first servo drive unit 14 receives a command from the computer 2 to move the first linear servo motor ten (10) microns along the first axis. The servo drive unit 14 then sends power to the first linear servo motor 30 to drive it together with the first and second stages (not shown) along the first axis. The first scanning head 46 sends positional information to the first servo drive unit 14. The first servo drive unit 14 interpolates the positional information and sends the current motor position to the computer 2.

The first servo drive unit 14 also sends control signals to the first axis linear servo motor 30 based on the scanning head information and control signals received from the computer 2 via the optical fiber coupler 24, as shown in FIG. 1. Thus, by using closed-loop positional feedback through the use of the linear encoder to the first servo drive unit 14, the first linear servo motor can be moved to a pre-determined position within an accuracy of +/−0.5 microns or better—the alignment accuracy being dependent on the capabilities of the linear encoder and servo unit drive used.

FIGS. 2–3 show the wafer platform 118 mounted on the second stage 82. Chuck 124 movement along the Z axis is accomplished by employing a third rotary servo motor 120 and a resolver 122. The third rotary servo motor 120 is coupled to the chuck 124 via a ball screw assembly using a belt drive (not shown). This third rotary servo motor 120 is driven by a third servo drive unit (not shown), but the third servo drive unit does not rely on a linear encoder for positional information but instead uses a resolver 122 for sending feedback to the third servo drive unit. Movement about the theta axis is provided by a fourth rotary servo motor 126 employing a resolver 128 and a fourth servo drive unit (22 in FIG. 1). In the preferred embodiment, the rotary servo motors 120, 126 and resolvers 122, 128 are of the models described above.

Figure 4:
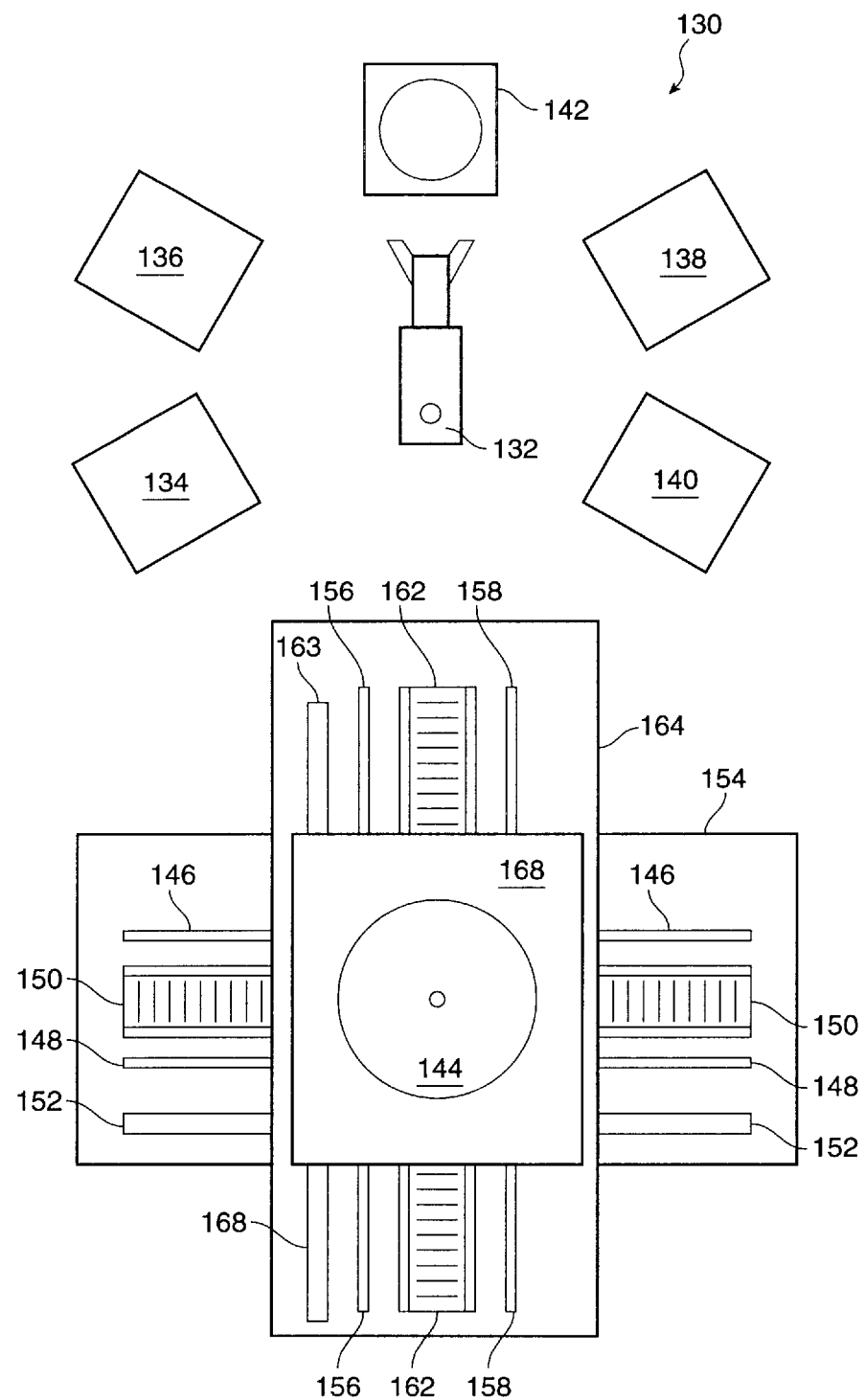
FIG. 4 is a top view of a wafer prober according to a presently preferred embodiment of the present invention and its juke box-type loader assembly.

FIG. 4 is an overhead view of one embodiment of the present invention showing a juke box-type automatic wafer loader 130 capable of loading wafer sizes between four (4) and twelve (12) inches in diameter using a robot arm 132 and four (4) cassettes 134, 136, 138, 140. Robot arm 132 is preferably model Per4mer 8000, currently available from CYBEQ SYSTEMS of Menlo Park, Calif. A pre-alignment platform 142 is also shown, as part of this embodiment of the present invention. It employs a rotary servo motor (not shown) for rough alignment of each untested wafer before loading on the chuck 144.

Also, FIG. 4 shows parallel ways 146, 148, a second linear motor element 150 of a first linear servo motor (not shown), and a first reference scale 152 mounted on base 154. Parallel ways 156, 158, a second linear motor element 162 of a second linear servo motor (not shown), and a second reference scale 168 are mounted to a first stage 164. The chuck 144 is mounted on a wafer platform (not shown) which is mounted on a second stage 168 which rides on ways 156, 158 through four runner blocks (not shown).

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

We claim:

1. An apparatus for positioning a semiconductor wafer for prober testing, said apparatus comprising:

a base having first way disposed along a first axis;

a first stage having a first runner block movably attached to said first way said base, and having a second way disposed along a second axis on a first side of said first stage;

a second stage having a second runner block movably attached to said second way, said first axis and said second axis not being parallel;

a first linear servo motor having a first linear motor element and a second linear motor element, said first linear motor element disposed parallel to said first axis on said base, said second linear motor element disposed parallel to said first axis on a second side of said first stage, said first linear motor element and said second linear motor element facing one another and engaged to position said first stage along said first axis;

a second linear servo motor having a third linear motor element and a fourth linear motor element, said third linear motor element disposed parallel to said second axis on said first side of said first stage, said fourth linear motor element disposed parallel to said second axis on a first side of said second stage, said third linear motor element and said fourth linear motor element facing one another and engaged to position said second stage along said second axis;

a first linear reference scale disposed parallel to said first axis;

a second linear reference scale disposed parallel to said second axis;

a first scanning head disposed on said first stage and positioned to read said first linear reference scale; and a second scanning head disposed on said second stage and positioned to read said second linear reference scale.

2. The apparatus of claim 1, further comprising:

a first servo drive unit coupled to said first linear servo motor for controlling said first linear servo motor;

a second servo drive unit coupled to said second linear servo motor for controlling said second linear servo motor; and a controller coupled to said first servo drive unit and said second servo drive unit for controlling the position of said first stage and said second stage along said respective first and second axes.

3. The apparatus of claim 1, further comprising:

a wafer platform attached to a second side of said second stage.

4. The apparatus of claim 2, further comprising:

a wafer platform attached to a second side of said second stage.

5. The apparatus of claim 3, wherein:

said wafer platform includes a rotary servo motor for rotationally positioning a wafer-bearing chuck of said wafer platform about a third axis.

6. The apparatus of claim 5, further comprising:

a Z-axis servo motor and drive for positioning said chuck vertically along a Z-axis orthogonal to said first and second axes.

7. The apparatus of claim 6, further comprising:

a third servo drive unit coupled to said rotary servo motor for controlling said rotary servo motor; and a fourth servo drive unit coupled to said Z-axis servo motor for controlling said Z-axis servo motor, said third servo drive unit and said fourth servo drive unit coupled to said controller, said controller additionally controlling the vertical position of said chuck and the rotational position of said chuck.

8. The apparatus of claim 7, further comprising:

a fiber optic data coupler connecting said first servo drive unit, said second servo drive unit, said third servo drive unit and said fourth servo drive unit to said controller.

9. An apparatus for positioning a semiconductor wafer for probe testing, said apparatus comprising:

a base having a first way disposed along a first axis;

a first stage having a first runner block movably attached to said first way said base, and having a second way disposed along a second axis on a first side of said first stage;

a second stage having a second runner block movably attached to said second way, said first axis and said second axis not being parallel;

a first linear servo motor having a first linear motor element and a second linear motor element, said first linear motor element disposed parallel to said first axis on said base, said second linear motor element disposed parallel to said first axis on a second side of said first stage, said first linear motor element and said second linear motor element facing one another and engaged to position said first stage along said first axis;

a second linear servo motor having a third linear motor element and a fourth linear motor element, said third linear motor element disposed parallel to said second axis on said first side of said first stage, said fourth linear motor element disposed parallel to said second axis on a first side of said second stage, said third linear motor element and said fourth linear motor element facing one another and engaged to position said second stage along said second axis;

a wafer platform having a chuck adapted to receive a semiconductor wafer for probe testing attached to a second side of said second stage, said wafer platform including a rotary servo motor for rotationally positioning a wafer-bearing chuck of said wafer platform about a third axis and a rotational position sensor for sensing a rotational position of said chuck;

a Z-axis servo motor and drive for positioning said chuck vertically along a Z-axis orthogonal to said first and second axes;

a Z-axis position sensor for sensing a Z-axis position of said chuck;

a first linear reference scale disposed parallel to said first axis;

a second linear reference scale disposed parallel to said second axis;

a first scanning head disposed on said first stage and positioned to read said first linear reference scale;

a first servo drive unit coupled to said first linear servo motor and said first scanning head for controlling said first linear servo motor;

a second servo drive unit coupled to said second linear servo motor and said second scanning head for controlling said second linear servo motor;

a third servo drive unit coupled to said rotary servo motor and said rotational position sensor for controlling said rotary servo motor;

a fourth servo drive unit coupled to said Z-axis servo motor and said Z-axis position sensor for controlling said Z-axis servo motor; and a controller coupled with a data link to said first servo drive unit, said second servo drive unit, said third servo drive unit and said fourth servo drive unit, said third servo drive unit and said fourth servo drive unit for controlling the position of said chuck along said first axis, said second axis, said Z-axis, and rotationally about said Z-axis.

10. The apparatus of claim 9, wherein said data link comprises an optical fiber.

11. The apparatus of claim 9, further comprising a programmable computer having program memory coupled to said controller for programmably controlling said controller.

12. The apparatus of claim 11, further comprising means for detecting a malfunction of the apparatus.

13. The apparatus of claim 12 further comprising means for alerting an attendant to a detected malfunction.

14. The apparatus of claim 13 wherein said means for alerting includes means for transmitting a signal on a network.

15. The apparatus of claim 1, wherein said first and second linear reference scales have evenly spaced optically detectable marks.

16. The apparatus of claim 15, wherein said evenly spaced optically detectable marks are spaced with a constant period of less than or equal to about four microns.

17. An apparatus for positioning a semiconductor wafer for probe testing, said apparatus comprising:

a base having a first way disposed along a first axis;

a first stage having a first runner block movably attached to said first way said base, and having a second way disposed along a second axis on a first side of said first stage;

a second stage having a second runner block movably attached to said second way, said first axis and said second axis not being parallel;

a first linear servo motor disposed to operate between said first stage and said base, said first linear servo motor including a first linear servo element and a second linear servo element, said first linear servo element and said second linear servo element disposed in opposition parallel to a first axis and engaged to position said first stage along said first axis;

a second linear servo motor disposed to operate between said first stage and said second stage, said second linear servo motor including a third linear servo element and a fourth linear servo element, said third and fourth linear servo elements disposed in opposition parallel to a second axis not parallel to said first axis and engaged to position said second stage along said second axis;

a chuck positioned along said first axis and said second axis by said first stage and said second stage;

a first linear reference scale disposed along said first axis;

a second linear reference scale disposed along said second axis;

a first scanning head disposed on said first stage and positioned to obtain position information from said first linear reference scale;

a second scanning head disposed on second stage and positioned to obtain position information from said second linear reference scale; and a controller coupled to said first linear servo motor and said second linear servo motor and said first scanning head and said second scanning head said controller adapted to position said chuck at a selected position in a plane defined by said first axis and said second axis with the difference between said selected position and an actual position achieved by said chuck being always less than or equal to five tenths of a micron.

18. The apparatus of claim 17, further comprising an automatic wafer loader, and wherein said automatic wafer loader and said chuck loading and holding, respectively, wafers of sizes ranging between four (4) to twelve (12) inches in diameter.

19. The apparatus of claim 17, further comprising automatic test equipment for providing diagnostic signals to a circuit under test and for measuring signals from circuit under test.

20. A method of positioning a chuck in a plane defined by a first axis and a second axis comprising the following steps of:

aligning a first stage along a first way which is aligned along a first axis, said step of aligning said first stage using a first linear servo motor controlled by feedback from a first linear encoder having a first scanning head disposed on said first stage to measure position information from a first linear reference scale disposed on a base and aligned along said first axis;

aligning a second stage along a second way which is aligned along a second axis, said step of aligning said second stage using a second linear servo motor controlled by feedback from a second linear encoder having a second scanning head disposed on said second stage to measure position information from a second linear reference scale disposed on said base and aligned along said second axis;

aligning a wafer chuck along a third axis using a third rotary servo motor, said third rotary servo motor fixedly attached to said second stage; and sending control and positioning information from a computer to driver units controlling said first and second linear servo motors and said third rotary servo motor via a data link.

21. The method of claim 20, further including the step of sending control and positioning information from a computer to driver units controlling said first and second linear servo motors via a data link including an optical fiber coupler.

22. The method of claim 20, further comprising the steps of:

placing a wafer having a plurality of dies on said chuck;

positioning a plurality of electrically conductive probes onto a plurality of electrically conductive pads disposed within one or more of said dies; and testing said one or more dies by applying electrical signals to said probes.

23. The method of claim 20, further comprising the step of:

pre-aligning said wafer before placing said wafer on said chuck.

24. The method of claim 20, further comprising the step of:

using an automatic wafer loader to load said wafer on said chuck.

25. The method of claim 20, further comprising the step of:

trouble-shooting and monitoring the testing of said wafer prober off-site using an ethernet card over a network.

26. The method of claim 20, further comprising the steps of:

detecting a failure on a wafer prober; and signalling said failure by modem to a pager.

* * * * *

UNITED STATES PATENT AND TRADEMARK OFFICE
CERTIFICATE OF CORRECTION

PATENT NO. : 5,773,951
DATED : June 30, 1998
INVENTOR(S) : Paul S. Markowski, Theodore J. Cosby It is certified that error appears in the above-identified patent and that said Letters Patent is hereby corrected as shown below:

---On Col. 1, line 40, replace "axes" with --axis--.
---On Col. 9, line 13, replace "22" with --20--.
---On Col. 9, line 32, replace "168" with --163--.
---On Col. 14, line 17, replace "ethernet" with --I/O--.
---In the drawings, Sheet 4, FIG. 4, replace the reference number "168" with --163--.

Signed and Sealed this

Twenty-fourth Day of November, 1998

Attest:

BRUCE LEHMAN

Attesting Officer

Commissioner of Patents and Trademarks